United States Patent [19]

Heaps et al.

[11] 4,137,355
[45] Jan. 30, 1979

[54] CERAMIC COATED WITH MOLTEN SILICON

[75] Inventors: Joseph D. Heaps, Shakopee; Obert N. Tufte, Minnetonka, both of Minn.

[73] Assignee: Honeywell Inc., Minneapolis, Minn.

[21] Appl. No.: 861,760

[22] Filed: Dec. 19, 1977

Related U.S. Application Data

[60] Division of Ser. No. 748,982, Dec. 9, 1976, Pat. No. 4,112,135, Continuation of Ser. No. 625,443, Oct. 24, 1975, abandoned.

[51] Int. Cl.$^2$ .............................. B32B 3/10; B32B 9/04
[52] U.S. Cl. .................................... 428/201; 357/85; 428/210; 428/408; 428/446
[58] Field of Search .................. 357/85; 428/201, 210, 428/408, 446

[56] References Cited
U.S. PATENT DOCUMENTS 3,137,590   6/1964   Coes .................................. 427/333 X

*Primary Examiner*—James R. Hoffman
*Attorney, Agent, or Firm*—Omund R. Dahle

[57] ABSTRACT

It is desirable to coat large area, thin sheets of large-grain polycrystalline silicon on an inexpensive ceramic substrate for use in solar cell applications and the like. Such ceramic substrate as are used are chosen from those having thermal expansion coefficients similar to those of silicon. The ceramics meeting these requirements, for example mulite, alumina and zirconia, when brought into contact with molten silicon, however, are not wet by the silicon and no coating takes place. In this invention the structure includes an interface layer comprising carbon on the surface of such a substrate to render the surface wettable by molten silicon. With this interface layer the ceramic of the type which is not wet by molten silicon can be successfully coated with silicon.

3 Claims, 4 Drawing Figures

CERAMIC COATED WITH MOLTEN SILICON

This is a division, of application Ser. No. 748,982, filed Dec. 9, 1976, now U.S. Pat. No. 4,112,135 which is a Continuation application of prior application Ser. No. 625,443 filed Oct. 24, 1975 now abandoned.

BACKGROUND AND SUMMARY OF THE INVENTION

Polycrystalline silicon films can be vapor deposited by sputtering or chemical deposition on numerous types of substrates including ceramic, but the grain size of the resulting layers is small compared to the dip-coated layer taught herein. Small grain size is not conducive to solar cells for moderate efficiency.

Prior to this invention there was no known method for coating silicon on an inexpensive ceramic substrate, having compatible thermal expansion characteristics, by dipping in molten silicon. Materials such as graphite or carbon are wet by silicon and can be dip-coated, but the large thermal expansion mismatch causes deformity and/or cracking. Ceramic substrates can be chosen and/or synthesized with thermal expansion characteristics similar to those of silicon. Ceramics, however, when dipped into molten silicon, are not wet by the silicon; hence, no coating takes place.

By means of the present invention, it has been discovered that if the ceramic is carbonized prior to being dipped into silicon, a thin film of silicon forms when the substrate is dipped into molten silicon and removed. The carbon layer first reacts with the molten silicon to form a silicon-carbon compound which we presume to be silicon carbide (SiC). As the SiC is formed, it is readily wet by the silicon. When the substrate is withdrawn from the melt, it produces a large grain silicon coating whose thickness can be controlled by the speed with which the substrate is pulled from the melt and/or the temperature of the melt.

More specifically, this invention describes one method for adequately carbonizing the ceramic substrate and it describes temperatures and pull rates which can be used to form large area silicon layers which adhere to the ceramic substrate. Polycrystalline layers formed by pulling a substrate from molten silicon have large individual crystallites and the crystallite size can be much greater than the thickness of the silicon layer.

DESCRIPTION

The present invention comprises a method for dip-coating suitable ceramic sheets into molten silicon of solar cell purity to provide low-cost, large area polycrystalline silicon sheets for use in solar cell panels.

Sheet ceramic is our preferred choice for a substrate material, since metals in general dissolve in molten silicon and do not have suitable thermal expansion coefficients. Silicon very nicely wets either graphite or carbon, but the large thermal expansion mismatch causes prohibitive warping when thin sheets of carbon or graphite are used. The thermal expansion properties of a ceramic can be matched to those of silicon by proper formulation of the ceramic. A few existing commercially available ceramics appear to satisfy this condition, such as, for example, mullite ($3Al_2O_3.2SiO_2$), alumina ($Al_2O_3$), or zirconia ($ZrO_2.SiO_2$). Ceramics, however, are not wet by molten silicon, so it is necessary to coat the ceramic with an ingredient that will effect wetting. We have discovered that coating the surface of a ceramic with carbon will accomplish the necessary wetting. In one specific embodiment, the coating, or carbonizing, comprises "scrubbing" or "rubbing" the surface of the ceramic with carbon followed by wiping off the excess carbon powder prior to dipping into molten silicon. The carbon coating may be applied equally well by an air blasting procedure and may, in fact, be performed in numerous other ways such as a pyrolytic process. In one embodiment, the carbon we used is called "Ultra Carbon" available from Ultra Carbon Corp., Bay City, Mich. Also, other grades of purity of carbon may be used.

Figure 1:
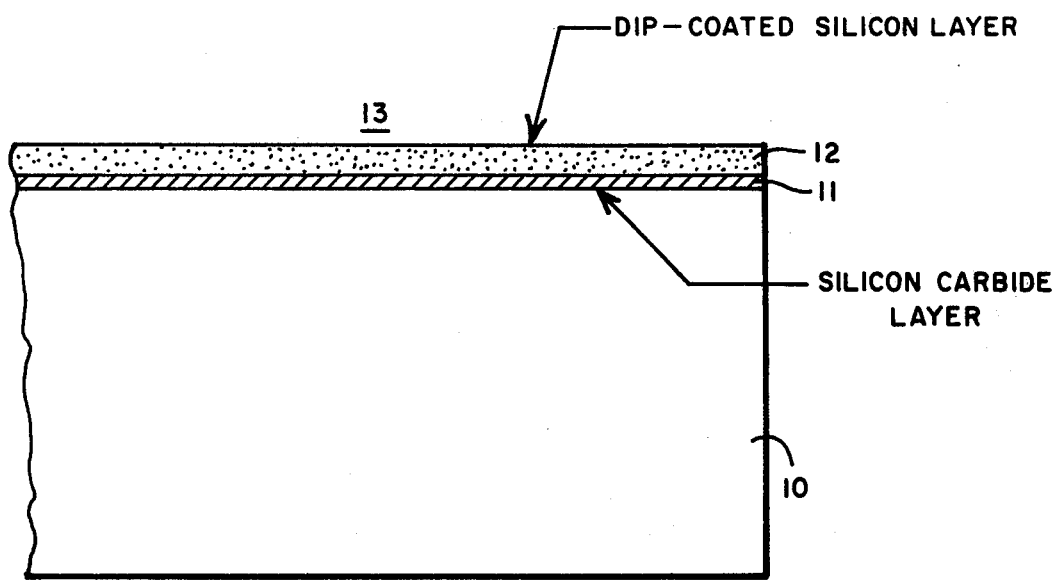
FIG. 1 is a cross-section of a dip-coated layer of sheet silicon on a ceramic substrate.

In FIG. 1, which is a cross-section of a dip-coated layer of sheet silicon on a ceramic substrate, there is shown a substrate 10, a silicon carbide intermediate layer 11, and a silicon layer 12 forming the sheet silicon device 13. The thickness of the SiC layer and the thickness of the Si layer have been exaggerated for illustrative purposes.

On the basis of our present research, it is clear that a key feature of this process is the application of a carbon coating to the ceramic to form, upon dipping, a tightly bonded very thin layer of silicon carbide (SiC) 11 on the substrate which may be about 4-5 microns thick. The silicon carbide coating tightly adheres to the ceramic and additional heating and cooling cycles have not affected this bond.

In our model of the growth mechanisms in the dip-coating technique, the formation of a meniscus during withdrawals of the substrate at the point where the molten silicon comes in contact with the substrate is very important. The molten silicon "wets" the silicon carbide previously formed on the ceramic substrate and this wetting action, combined with the large surface tension of molten silicon (720 dynes/cm), leads to a 2 or 3 mm high meniscus which comes out of the silicon melt as the substrate is being withdrawn. The actual crystallization of the silicon onto the substrate occurs in this meniscus. The key to understanding the growth process and its potential for solar cell material is in the understanding and control of the liquid-solid interface which normally occurs near the top of the meniscus. The geometry of the liquid-solid interface is controlled to promote the nucleation of the silicon film on the previously grown silicon, rather than nucleating from the substrate. This results in crystallite sizes much larger than the layer thickness. The experimental results to date clearly show that the crystalline size is much greater than the layer thickness which clearly indicates that a high degree of nucleation from the previously grown silicon is occurring. In the limit, silicon material approaching a single crystal layer should be attainable if the nucleation occurs only on the previously grown silicon.

In silicon casting, it can be observed that, in general, the larger crystalline grains occur in regions where the liquid to solid transition occurred more slowly. Our dipping experiments also indicate that melt temperature and withdrawal time from the melt influence the crystallite size of the resulting layer. For example, a withdrawal rate of 0.3 cm/sec. and a temperature 5° C.

above the melting point has produced silicon coatings with approximately 1.5 mm grain sizes, whereas an increased withdrawal rate (1.0 cm/sec) at this temperature reduced the grain sizes to approximately 0.5 mm. Further, if this increased withdrawal rate (1.0 cm/sec) is used with a temperature only 0.5° C. above the melting point, the grain sizes again increase to ~1.0 mm. At the present time, withdrawal rates or pulling speeds from 0.1 cm/sec. to 1.0 cm/sec. have been used with the largest crystallites being obtained with the slower withdrawal rates.

Likewise, the withdrawal rate and melt temperature influence the layer thickness with thinner layers occurring at faster withdrawal rates and higher melt temperatures. Layer thicknesses from 25 $\mu$m to 100 $\mu$m have been prepared. Present results indicate that thickness between 75 $\mu$m and 100 $\mu$m produce the best layers.

The dip-coating is done in an atmosphere free of oxygen. Argon, for example, has been successfully used. Upon being withdrawn from the melt, the coated sheet is allowed to cool sufficient so that there is no appreciable formation of $SiO_2$ when removed from the Argon atmosphere.

Sample sheets of ceramic which have been silicon coated using this method have produced tightly adhering thin silicon layers with well developed individual crystallites as large as 1.5 mm across. A novel feature of the dip-coated layers is that the average crystallite areas are significantly larger than the layer thickness. This is an important factor where thin layers of material having minimum number of grain boundaries are to be achieved.

An advantage of this invention is that no unnecessary silicon is withdrawn from the melt by the dipping process. For solar panel use, one side of the ceramic substrate is carbonized so that the substrate layer emerges from the melt supporting a thin coating of large crystallite silicon 12 only on the carbonized face. For other applications, other patterns of silicon can be selectively coated on a ceramic substrate by this technique.

Although forming no portion of this invention, one application of the dip-coated ceramic sheet is to form a solar cell by diffusion of impurities into the sheet silicon layer to form a shallow pn junction or by the evaporation of a thin metal layer on the silicon surface to form a Schottky Diode. Such structures can also be used to form large area high current rectifiers.

Figure 3:
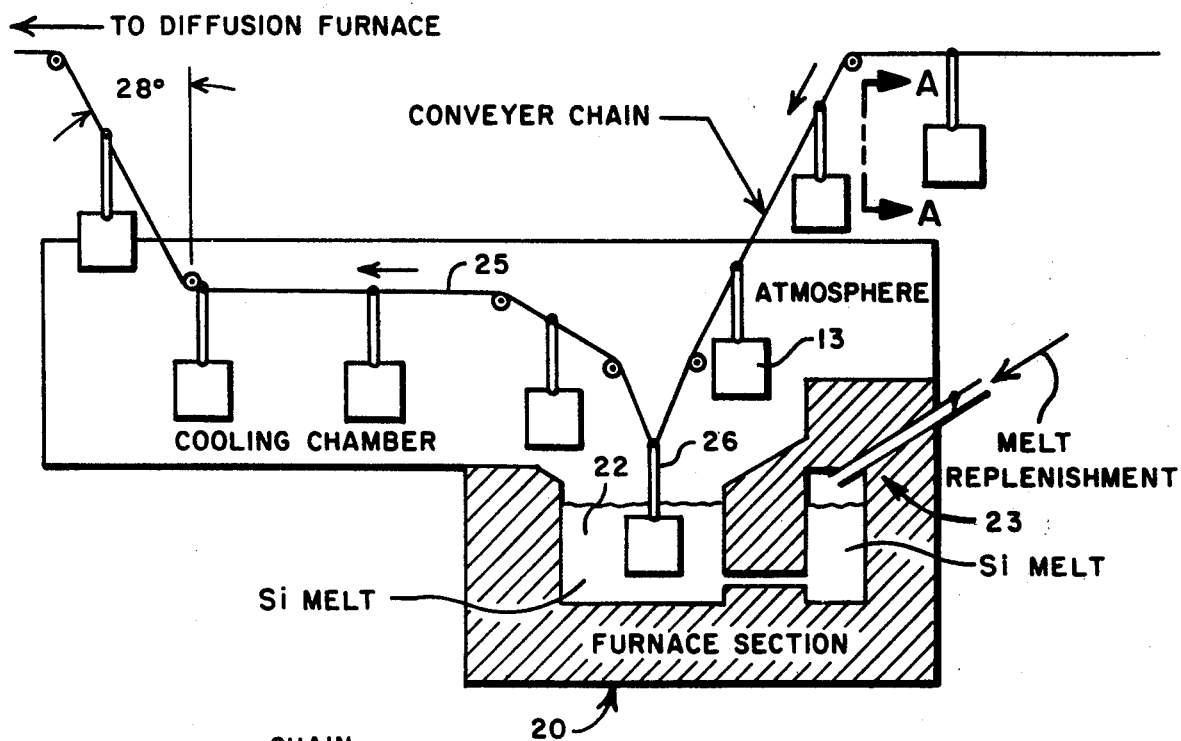
FIGS. 2 and 3 are diagrammatic plan views of a sheet silicon growth facility.
Figure 2:
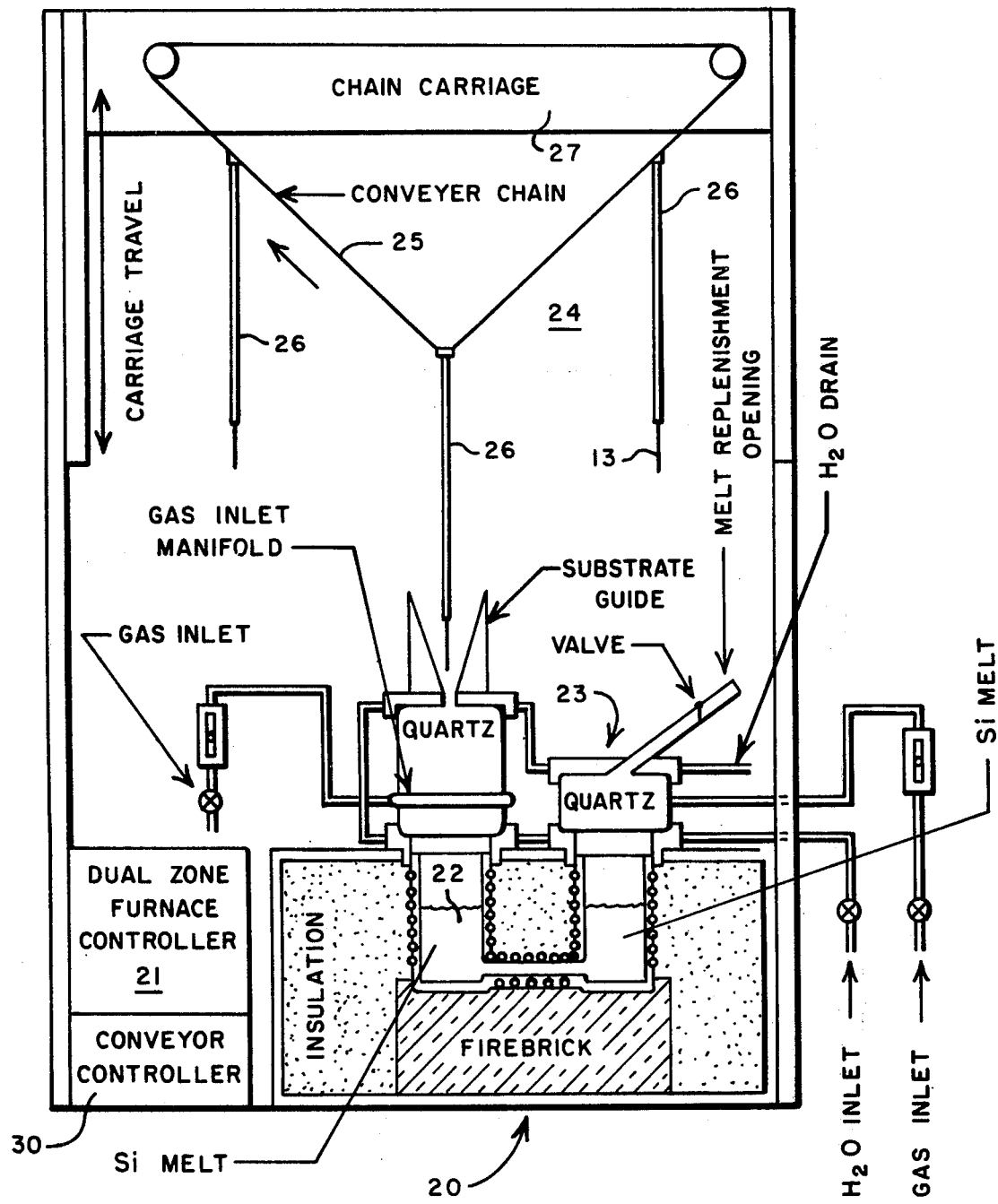

FIGS. 2 and 3 are diagrammatic plan views of a sheet silicon growth facility for dip-coating silicon on ceramic. A resistance furnace 20 having a controller 21 maintains a molten silicon charge 22. A melt replenishment arrangement is shown at 23. A conveyor 24 including a conveyor chain 25, suitable substrate hangers 26, chain carriage 27 and conveyor control means 30 carry the carbonized substrate into the facility, cause the substrate 13 to be dipped into the melt 22 at a desired rate, removed from the melt at a desired rate and the coated substrate moved on as the process is repeated with another substrate. A slightly pressurized chamber accomplishes the entry and leaving of the facility. The timing and velocities of the conveyor chain and chain carriage assembly are largely determined by the Si growth conditions.

Figure 3A:
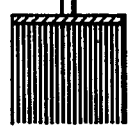
FIG. 3A is another view of a portion of FIG. 3.

FIG. 3a shows a cluster of sheets to be simultaneously dipped. The conveyor chain does not necessarily travel at a uniform velocity, but rather could be programmed to utilize a time x (for example, 40 seconds) for dipping the sheets into the melt, a time y (for example, 100 seconds) for withdrawing the substrate from the melt and a time z (for example, 10 seconds) for rapidly positioning the next cluster of sheets to be dipped. The time y may be varied as a function of the temperature of the melt. Because of the large heat of fusion of silicon (337 cal/gram), even though a plurality of substrates are simultaneously dipped, the energy withdrawn from the melt in heating the immersed substrates is only a small fraction of the energy required to cause solidification of the melt. This energy is replaced by the furnace.

The embodiments of the invention in which an exclusive property or right is claimed are defined as follows:

1. A crystalline silicon coating on a ceramic substrate comprising:
   a ceramic substrate of a type which is not wet by molten silicon;
   an interface layer comprising carbon on at least a portion of the surface of said ceramic body to render said surface portion wettable by molten silicon; and
   a layer of crystalline silicon grown onto said carbon coated ceramic by contacting the carbon coated ceramic with molten silicon to form said silicon layer.

2. A silicon semiconductor article comprising:
   a ceramic substrate of a type which is not wet by molten silicon, to at least a portion of which substrate a coating containing carbon has been added; and
   a crystalline layer of silicon grown on the substrate at said portion where said coating had been added.

3. The invention according to claim 2 wherein said crystalline layer is grown from molten silicon.

* * * * *